United States Patent
Huang et al.

(10) Patent No.: US 7,830,181 B1
(45) Date of Patent: Nov. 9, 2010

(54) DEGLITCH CIRCUIT

(75) Inventors: Ting-Chun Huang, Taipei (TW);
Kuan-Yu Chen, Hualien County (TW);
Yuan-Hsun Chang, Kaohsiung (TW)

(73) Assignee: Faraday Technology Corp.,
Science-Based Industrial Park, Hsin-Chu
(TW)

( * ) Notice: Subject to any disclaimer, the term of this
patent is extended or adjusted under 35
U.S.C. 154(b) by 0 days.

(21) Appl. No.: 12/555,181

(22) Filed: Sep. 8, 2009

(51) Int. Cl.
*H03K 5/00* (2006.01)
(52) U.S. Cl. .......................... 327/34; 327/551
(58) Field of Classification Search .................. 327/34,
327/551–559
See application file for complete search history.

(56) References Cited

U.S. PATENT DOCUMENTS 5,760,612 A * 6/1998 Ramirez ....................... 327/34
6,134,252 A * 10/2000 Aspacio et al. ............... 372/34
7,224,212 B2 * 5/2007 Tseng ......................... 327/551
7,397,292 B1 * 7/2008 Potanin ....................... 327/261

* cited by examiner

Primary Examiner—Dinh T. Le
(74) Attorney, Agent, or Firm—Winston Hsu; Scott Margo

(57) ABSTRACT

A deglitch circuit including signal transmission units is provided. The signal transmission units are connected in serial to form a signal transmission unit string, and a first signal transmission unit of the signal transmission unit string receives a digital signal. Each signal transmission unit includes a first switch, a first delay circuit and a second switch. First and second terminals of the first switch are coupled to a previous signal transmission unit of the signal transmission unit string and an input terminal of the first delay circuit, respectively. The second switch is coupled between an output terminal of the first delay circuit and a first voltage. When the digital signal has a first logic state, the first switch is turned off, and the second switch is turned on. When the digital signal has a second logic state, the first switch is turned on, and the second switch is turned off.

14 Claims, 6 Drawing Sheets

DEGLITCH CIRCUIT

BACKGROUND OF THE INVENTION

1. Field of the Invention

The present invention relates to a glitch eliminating circuit. More particularly, the present invention relates to a deglitch circuit.

2. Description of Related Art

In a high-speed transmission system and interface, for example, a universal serial bus (USB), a peripheral component interconnect express (PCI-E) or a serial advanced technology attachment (SATA), a receiver thereof generally determines whether a received data signal is an effective data or a noise through a high-speed comparator. If differential amplitude of the data signal is greater than a reference voltage, and the comparator determines the data signal is the effective data, the comparator can output "0" to represent that the data signal is the effective data. Conversely, if the differential amplitude of the data signal is less than the reference voltage, and the comparator determines the data signal is the noise, the comparator can output "1" to represent that the data signal is the noise.

FIG. 1 is a schematic diagram illustrating generation of a glitch waveform. Referring to FIG. 1, in case of an ideal circumstance, a rising and a falling time of a differential signal pair (data signal) $D_p$ and $D_m$ transmitted by a transmitter are all regarded to be zero, so that the differential amplitude remains greater than the reference voltage during a transition period of the data signal, and the comparator determines the data signal is the effective data. Therefore, the comparator can output an ideal waveform $S_{ideal}$ of FIG. 1. However, in case of an actual high-speed transmission, the rising and the falling time of the data signal (the differential signal pair $D_p$ and $D_m$) transmitted by the transmitter cannot approach to zero; the longer the transmission cable is, the more moderate the waveform of the data signal received by a receiver tends to be. During a voltage level switch process caused by logic transition (for example, logic 0 is transited to be logic 1) of the data signal $D_p/D_m$, since a difference (i.e. the differential amplitude during the switch process) of the data signal $D_p/D_m$ at a rising edge and a falling edge can be temporarily less than the reference voltage, an actual output waveform $S_{Real}$ of the comparator may have glitch during the voltage level switch process of the data signal $D_p/D_m$. Such phenomenon can cause errors of data received by the transmission system.

Therefore, an output of such high-speed comparator is generally processed by a deglitch circuit to eliminate the undesired glitch. A commonly used deglitch circuit is shown as FIG. 2A, FIG. 2A is a schematic diagram illustrating a conventional deglitch circuit. Referring to FIG. 2A, a delay circuit 201 of the deglitch circuit 200 first delays the glitch to generate a delay signal, and then a logic operation is performed to the delay signal and an original output signal of the comparator (not shown) by an AND gate 202 to eliminate the glitch.

FIG. 2B is a schematic diagram of signal waveforms of FIG. 2A. Referring to FIG. 2A and FIG. 2B, after the AND gate 202 performs the logic operation to the output signal $S_Q$ of the comparator and the delay signal $S_{QD}$ of the delay circuit 201, the glitch is removed from an output waveform $S_{DG}$ of the AND gate 202. However, such method has two shortages, one is that a glitch width that can be eliminated by the deglitch circuit 200 is limited, and when the glitch width is too broad, regardless of how the output signal $S_Q$ being delayed, the output signal $S_Q$ and the delayed signal $S_{QD}$ cannot be totally interlaced, so that the possibly appeared glitches cannot be totally removed. The second shortage is that the delay time of the delay circuit can be drifted along with a fabrication process. In case of different process corners, the delay time can be different, so that the glitch width that can be eliminated is further limited. The faster the operation speed of the transmission circuit is, and the longer the transmission cable is, the higher occupation ratio the rising time and the falling time of the data signal in a cycle is. Therefore, a broader glitch is generated, and the deglitch circuit 200 is no longer applicable.

Another commonly used method is to apply a peak detector of FIG. 3A. FIG. 3A is schematic diagram of a conventional peak detector. FIG. 3B is a schematic diagram illustrating signal waveforms of FIG. 3A. Referring to FIG. 3A and FIG. 3B, a principle of the peak detector 300 is as follows. According to uni-directionality of diodes D1 and D2, when the data signals $D_p$ and $D_m$ are greater than conducting voltages of the diodes D1 and D2, a capacitor C is charged, so that a voltage level of the capacitor C can be increased. When the voltage levels of the data signals $D_p$ and $D_m$ are switched, since the diodes D1 and D2 are unidirectional, the capacitor C is not discharged towards an input terminal of the peak detector 300, but can only be discharged through a tiny discharge current source IL. Therefore, as long as the data signal $D_p/D_m$ has data, a voltage of an output signal Out can be maintained above a voltage Va.

When the data signal $D_p/D_m$ has no data, the voltage of the output signal Out is pulled to "0" through the discharge current source IL, so as to determine the data signal $D_p/D_m$ has no data. The peak detector 300 has two shortages, one is that a propagation delay of such circuit is related to an amplitude of an input signal (i.e. the data signal $D_p/D_m$), the smaller the amplitude of the output signal is, the smaller the charging current of the capacitor that passes through the diodes D1 and D2 is, and the longer the propagation delay that the output signal is changed from "0" to "1" is. Namely, a time for the voltage of the output signal Out being charged from a low voltage level to a high voltage level is prolonged. Comparatively, the greater the amplitude of the output signal is, the longer the propagation delay that the output signal is changed from "1" to "0" is. Namely, a time for the voltage of the output signal Out being discharged from the high voltage level to the low voltage level is prolonged. Therefore, the peak detector 300 cannot effectively control the propagation delay.

The second shortage is that only non-ideal diodes can be used for an actual implementation, and if a MOS transistor is applied to implement the uni-directionality of the diode, a tiny inverse current still exists, and the inverse current can result in a fact that a direct current (DC) transition point cannot be accurately controlled. In a general is high-speed transmission system, there have specifications of the DC transition point and an alternating current (AC) transition point. If the peak detector 300 is applied to avoid the glitch, a design of the DC transition point and the AC transition point is difficult. Moreover, the transmission system has a specification of the propagation delay, and the time of the propagation delay cannot be accurately controlled when the peak detector 300 is used. Therefore, though application of the peak detector 300 can eliminate the glitch, design of other specifications of the transmission system is influenced, so that the application of the peak detector 300 is limited.

SUMMARY OF THE INVENTION

The present invention is directed to a deglitch circuit, which can eliminate a glitch generated by a comparator during a voltage level switch process of a data signal.

The present invention provides a deglitch circuit including a plurality of signal transmission units. The signal transmission units are connected in serial to form a signal transmission unit string, and a first signal transmission unit of the signal transmission unit string receives a digital signal. Each signal transmission unit includes a first switch, a first delay circuit and a second switch. A first terminal of the first switch is coupled to a previous signal transmission unit of the signal transmission unit string. An input terminal of the first delay circuit is coupled to a second terminal of the first switch. The second switch is coupled between an output terminal of the first delay circuit and a first voltage. When the digital signal has a first logic state, the first switch is turned off, and the second is turned on. When the digital signal has a second logic state, the first switch is turned on, and the second is turned off.

In an embodiment of the present invention, the first delay circuit includes a first resistor and a first capacitor. A first terminal of the first resistor is coupled to the second terminal of the first switch. The first capacitor is coupled between a second terminal of the first resistor and a second voltage.

In an embodiment of the present invention, each of the signal transmission units includes a buffer, wherein an input terminal of the buffer is coupled to the output terminal of the first delay circuit, and an output terminal of the buffer is coupled to a next signal transmission unit of the signal transmission unit string.

In an embodiment of the present invention, each of the signal transmission units further includes a first inverter, a third switch, a second delay circuit, a fourth switch and a second inverter. An input terminal of the first inverter is coupled to the output terminal of the first delay circuit. A first terminal of the third switch is coupled to an output terminal of the first inverter. An input terminal of the second delay circuit is coupled a second terminal of the third switch. The fourth switch is coupled between an output terminal of the second delay circuit and a third voltage. An input terminal of the second inverter is coupled to the output terminal of the second delay circuit, and an output terminal of the second inverter is coupled to a next signal transmission unit of the signal transmission unit string. When the digital signal has the first logic state, the third switch is turned off, and the fourth switch is turned on. When the digital signal has the second logic state, the third switch is turned on, and the fourth switch is turned off.

In an embodiment of the present invention, the second delay circuit includes a second resistor and a second capacitor. A first terminal of the second resistor is coupled to the second terminal of the third switch. The second capacitor is coupled between a second terminal of the second resistor and the second voltage.

According to the deglitch circuit of the present invention, when the digital signal has the first logic state, the signal transmission units synchronously output the first logic, and when the digital signal has the second logic state, the signal transmission units sequentially output the digital signal. By such means, when the digital signal has the glitch (i.e. the digital signal has the second logic state), the digital signal is delayed for transmission due to the plurality of the signal transmission units, and when the digital signal is recovered to the first logic state, the glitch can be eliminated due to synchronous output of the signal transmission units.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
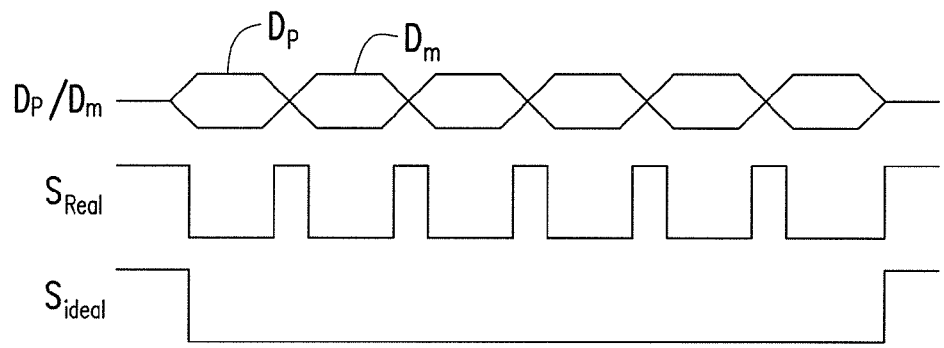
FIG. 1 is a schematic diagram illustrating generation of a glitch waveform.
Figure 2A:
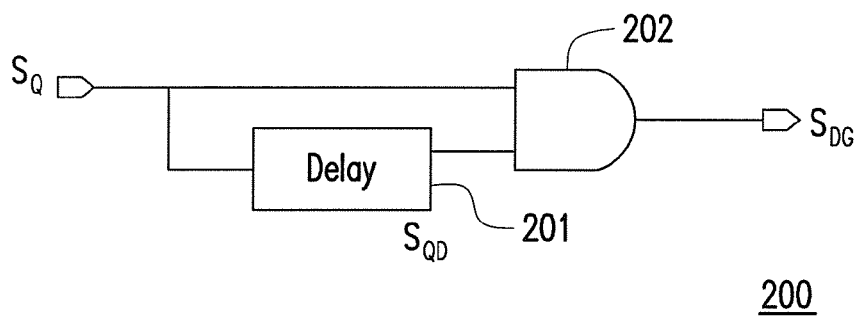
FIG. 2A is a schematic diagram illustrating a conventional deglitch circuit.
Figure 2B:
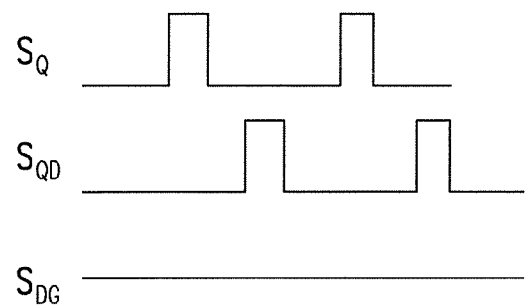
FIG. 2B is a schematic diagram of signal waveforms of FIG. 2A.
Figure 3A:
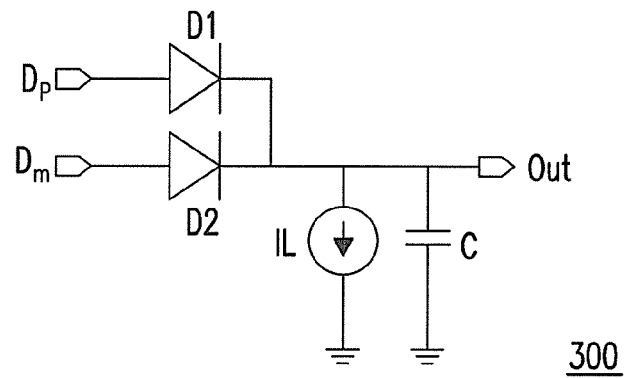
FIG. 3A is schematic diagram of a conventional peak detector.
Figure 3B:
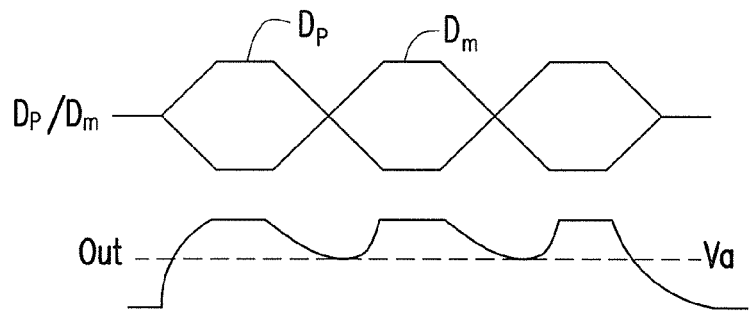
FIG. 3B is a schematic diagram illustrating signal waveforms of FIG. 3A.
Figure 4A:
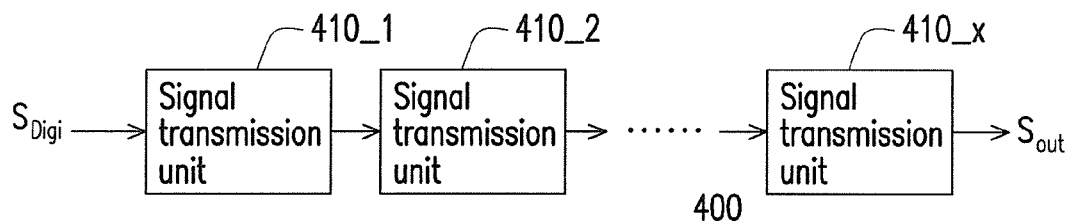
FIG. 4A is a system schematic diagram of a deglitch circuit according to an embodiment of the present invention.

FIG. 4A is a system schematic diagram of a deglitch circuit according to an embodiment of the present invention. Referring to FIG. 4A, the deglitch circuit 400 includes signal transmission units 410_1-410_X. The signal transmission units 410_1-410_X are connected in serial to form a signal transmission unit string, and the first signal transmission unit 410_1 of the signal transmission unit string receives a digital signal $S_{Digi}$, wherein the digital signal $S_{Digi}$ is, for example, an output signal of a comparator (not shown) of a high-speed transmission system. When the digital signal $S_{Digi}$ is transited to a first logic state, the signal transmission units 410_1-410-X synchronously output the first logic. When the digital signal $S_{Digi}$ is transited to a second logic state, the signal transmission units 410_1-410-X sequentially transmit the digital signal $S_{Digi}$ one after another. An output terminal of the last signal transmission unit 410_X of the signal transmission unit string serves as an output terminal of the deglitch circuit 400 to provide an output signal Sout.

Figure 4B:
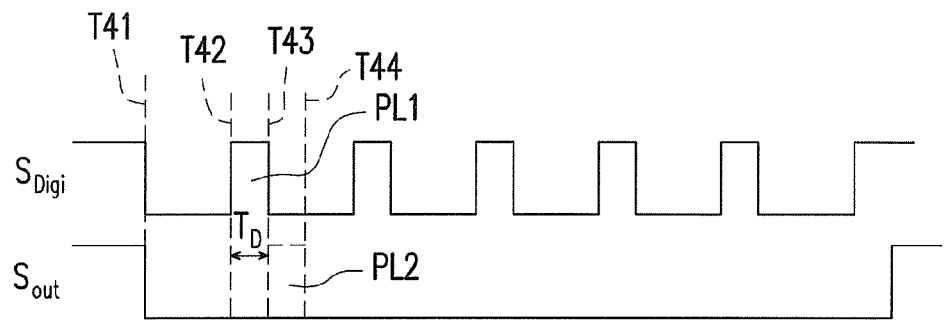
FIG. 4B is a waveform diagram of a digital signal and an output signal of FIG. 4A.

FIG. 4B is a waveform diagram of the digital signal $S_{Digi}$ and the output signal Sout of FIG. 4A. Referring to FIG. 4A and FIG. 4B, when the digital signal $S_{Digi}$ is changed from a second logic state (for example, a logic high voltage level) to a first logic state (for example, a logic low voltage level), the signal transmission units 410_1-410_X synchronously output the logic low voltage level. In other words, when the digital signal $S_{Digi}$ is changed to the logic low voltage level, the signal transmission unit 410_X can synchronously output the logic low voltage level, so that a time point T41 of a falling edge of the waveform of the digital signal $S_{Digi}$ is almost the same to that of a falling edge of the waveform of the output signal Sout.

According to an operation principle of a comparator in a high-speed transmission system, assuming a glitch PL1 is generated in the comparator (not shown) during time point T42-T43, and the glitch PL1 is assumed to have the logic high voltage level. Namely, during the time points T42-T43, the digital signal $S_{Digi}$ is changed to the logic high voltage level, and the signal transmission units 410_1-410_X can sequentially transmit the digital signal $S_{Digi}$, so that the glitch PL1 is supposed to be appeared in the output signal Sout during the time points T43-T44 (a glitch PL2 shown in dash lines). However, at the time point T43, the digital signal $S_{Digi}$ is again changed to the logic low voltage level, so that the signal transmission units 410_1-410_X synchronously output the logic low voltage level. Therefore, during the time points T42-T43, the signal transmission units 410_1-410_X transmit the logic high voltage level of the glitch PL1 one after another, while at the time point T43, the signal transmission units 410_1-410_X synchronously output the logic low voltage level, so that the glitch PL1 can be removed during the transmission, and the output signal Sout is still maintained to have the logic low voltage level.

Wherein, a time period $T_D$ represents a time length of a signal delay of the signal transmission unit string 410_1-410_X. The time period $T_D$ can be adjusted by adjusting an amount of the signal transmission units or adjusting a signal delay time of each of the signal transmission units. Moreover, if the time period $T_D$ is greater than a transmission time of a bit (a bit time), regardless of the width of the glitch PL1, when the digital signal $S_{Digi}$ is recovered to the logic low voltage level, the glitch PL1 can be eliminated due to the signal transmission units 410_1-410_X synchronously outputting the logic low voltage level.

Figure 5:
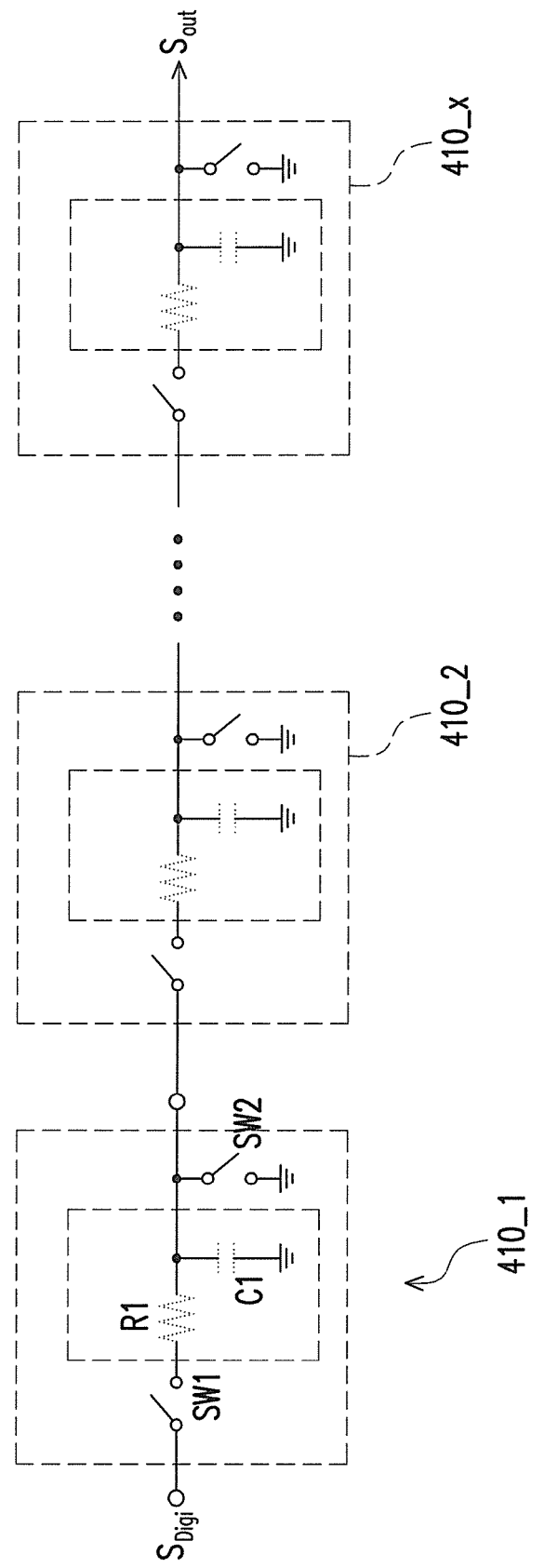
FIG. 5 is a circuit diagram of a signal transmission unit 410_1 of FIG. 4A.

For a further description of the present embodiment, how the signal transmission unit is implemented is described in detail below. Taking the signal transmission unit 410_1 as an example, and the signal transmission units 410_2-410_X can be deduced by analogy. FIG. 5 is a circuit diagram of the signal transmission unit 410_1 of FIG. 4A. Referring to FIG. 5, the signal transmission unit 410_1 includes a first switch SW1, a first delay circuit and a second switch SW2. In the present embodiment, the first delay circuit includes a first resistor R1 and a first capacitor C1. A first terminal of the first resistor R1 serves as an input terminal of the first delay circuit and is coupled to a second terminal of the first switch SW1. The first capacitor C1 is coupled between a second terminal of the first resistor R1 and a second voltage (for example, a ground voltage). In other embodiments, a parasitic resistance and a parasitic capacitance on a signal path can be used to respectively implement the first resistor R1 and the first capacitor C1, so as to save the physical resistor and the physical capacitor.

A first terminal of the first switch SW1 serves as an input terminal of the signal transmission unit 410_1, and is coupled to a previous signal transmission unit of the signal transmission unit string. Since the signal transmission unit 410_1 is the first signal transmission unit of the signal transmission unit string, the first terminal of the first switch SW1 is used for receiving the digital signal $S_{Digi}$. The second terminal of the first switch SW1 is coupled to the first terminal of the first resistor R1. The second switch SW2 is coupled between the second terminal of the resistor first R1 and a first voltage (for example, the ground voltage). In the present embodiment, the second terminal of the first resistor R1 serves as an output terminal of the signal transmission unit 410_1, and is coupled to a next signal transmission unit (the signal transmission unit 410_2) of the signal transmission unit string.

Those skilled in the art can implement the switches SW1 and SW2 according to any method. For example, a transmission gate can be used to implement the first switch SW1, and a NMOS transistor can be used to implement the second switch SW2.

Referring to FIG. 4B and FIG. 5, since in the signal transmission units 410_2-410_X, when the digital signal $S_{Digi}$ has the logic low voltage level (for example, during the time points T41-T42), the first switch SW1 is turned off, and the second switch SW2 is turned on, so that the signal transmission units 410_1-410_X can synchronously output the ground voltage (regarded as the logic low voltage level). When the digital signal $S_{Digi}$ has the logic high voltage level (for example, during the time points T42-T43), the first switch SW1 is turned on, and the second switch SW2 is turned off, so that the digital signal $S_{Digi}$ can charge the first capacitor C1, and a charging effect of the RC circuit can cause a propagation delay of the digital signal $S_{Digi}$ having the logic high voltage level. A propagation delay time can be adjusted by changing a resistance of the first resistor R1 and a capacitance of the first capacitor C1. When the digital signal $S_{Digi}$ is again recovered to the logic low voltage level (for example, during the time points T43-T44), circuit operations of the signal transmission units 410_1-410_X are the same to that during the time points T41-T42, and the signal transmission units 410_1-410_X can synchronously output the logic low voltage level.

Figure 6:
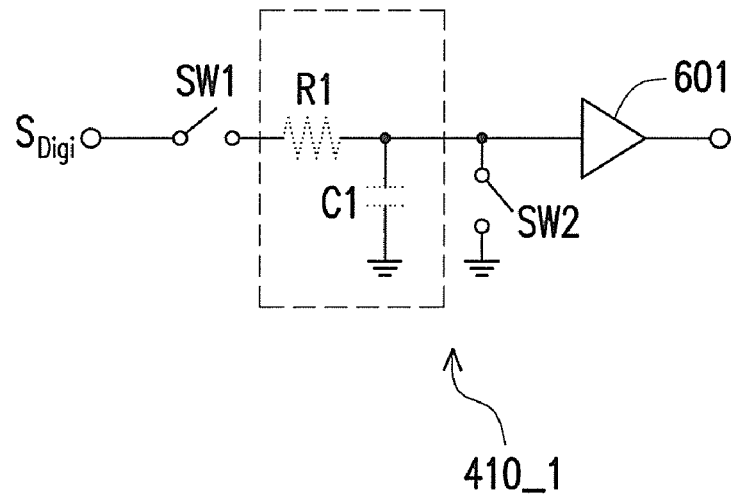
FIG. 6 is another circuit diagram of a signal transmission unit 410_1 of FIG. 4A.

The circuit shown in FIG. 5 is only one of the embodiments of the signal transmission unit, and those skilled in the art can modify the embodiment of FIG. 5 according to actual requirements. For example, FIG. 6 is another circuit diagram of the signal transmission unit 410_1 of FIG. 4A. Here, only the signal transmission unit 410_1 is taken as an example for description, and other signal transmission units 410_2-410_X can be deduced by analogy. Referring to FIG. 5 and FIG. 6, a difference there between lies in a buffer 601, and other devices with similar functions have like reference numerals, and detailed descriptions thereof are not repeated. In the embodiment of FIG. 6, the second terminal of the first resistor R1 is not the output terminal of the signal transmission unit 410_1. An input terminal of the buffer 601 is coupled to the second terminal of the first resistor R1, and an output terminal of the buffer 601 serves as the output terminal of the signal transmission unit 410_1 and is coupled to a next signal transmission unit (for example, the signal transmission unit 410_2) of the signal transmission unit string. The circuit operation of the embodiment of FIG. 6 is the same to that of the embodiment of FIG. 4, and by adding the buffer 601, the propagation delay time of the signal transmission unit 410_1 can be increased.

Figure 7:
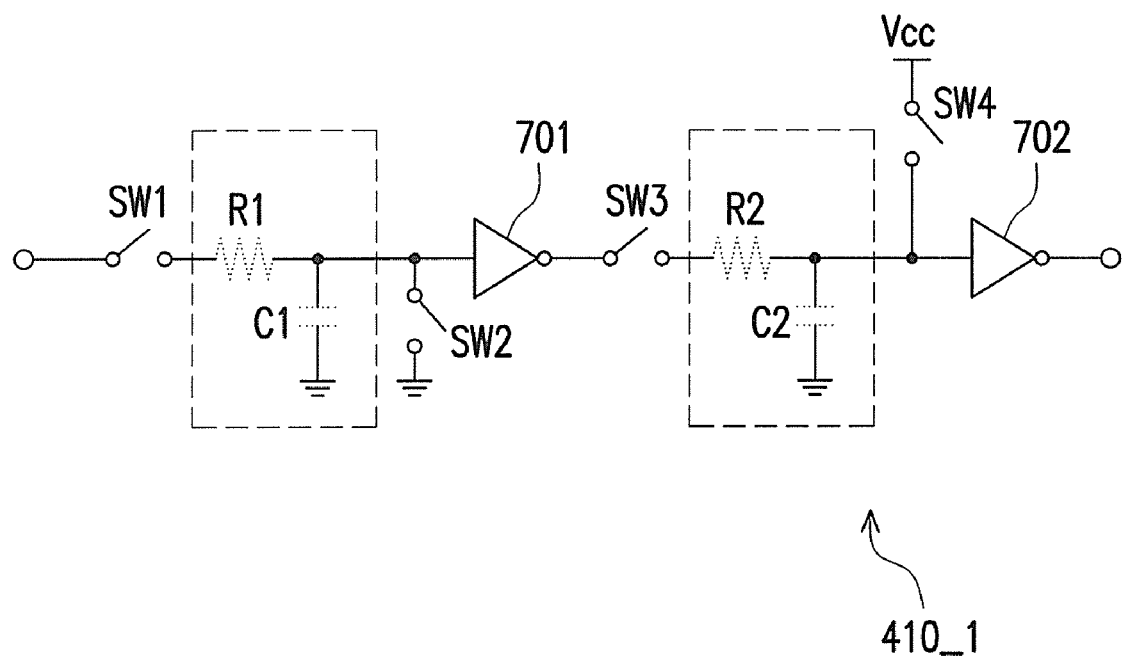
FIG. 7 is still another circuit diagram of a signal transmission unit 410_1 of FIG. 4A.

Besides the signal transmission unit shown in FIG. 6, those skilled in the art can modify the embodiment of FIG. 5 according to other methods. For example, FIG. 7 is still another circuit diagram of the signal transmission unit 410_1 of FIG. 4A. Here, only the signal transmission unit 410_1 is taken as an example for description, and other signal transmission units 410_2-410_X can be deduced by analogy. Referring to FIG. 5 and FIG. 7, the devices with similar functions have like reference numerals, and detailed descriptions thereof are not repeated. A difference between the embodiment of FIG. 5 and the embodiment of FIG. 7 is that the signal transmission unit 410_1 of FIG. 7 further includes a first inverter 701, a third switch SW3, a second delay circuit, a fourth switch SW4, and a second inverter 702. In the present embodiment, the second delay circuit includes a second resistor R2 and a second capacitor C2. A first terminal of the second resistor R2 is coupled to a second terminal of the third switch SW3. The second capacitor C2 is coupled between a second terminal of the second resistor R2 and the second voltage (for example, the ground voltage). In other embodiments, a parasitic resistance and a parasitic capacitance on a signal path can be used to respectively implement the second resistor R2 and the second capacitor C2, so as to save the physical resistor and the physical capacitor.

In the embodiment of FIG. 7, the second terminal of the first resistor R1 is not the output terminal of the signal transmission unit 410_1. An input terminal of the first inverter 701 is coupled to the second terminal of the first resistor R1, and an output terminal of the first inverter 701 is coupled to a first terminal of the third switch SW3. The first terminal of the second resistor R2 is coupled to the second terminal of the third switch SW3. The first capacitor C1 is coupled between the second terminal of the second resistor R2 and the ground voltage. The fourth switch SW4 is coupled between the second terminal of the second resistor R2 and a third voltage (for example, a system voltage Vcc). An input terminal of the second inverter 702 is coupled to the second terminal of the second resistor R2, and an output terminal of the second inverter 702 serves as the output terminal of the signal transmission unit 410_1, and is coupled to a next signal transmission unit (the signal transmission unit 410_2) of the signal transmission unit string.

Referring to FIG. 4B and FIG. 7, when the digital signal $S_{Digi}$ has the logic low voltage level (for example, during the time points T41-T42), the switches SW1 and SW3 are turned off, and the switches SW2 and SW4 are turned on, so that the first capacitor C1 is discharged through the second switch SW2, and the system voltage Vcc can charge the second capacitor C2 through the fourth switch SW4. Meanwhile, the first inverter 701 receives the ground voltage (regarded as the logic low voltage level) through the second switch SW2, and outputs the logic high voltage level, and the second inverter 702 receives the system voltage Vcc (regarded as the logic high voltage level) through the fourth switch SW4, and outputs the logic low voltage level. Therefore, the signal transmission units 410_1-410_X can simultaneously output the logic low voltage level.

When the digital signal $S_{Digi}$ is transited to the logic high voltage level (for example, during the time points T42-T43), the switches SW1 and SW3 are turned on, and the switches SW2 and SW4 are turned off, so that the digital signal $S_{Digi}$ can charge the first capacitor C1 through the first switch SW1 and the first resistor R1. Now, the first inverter 701 still outputs the logic high voltage level, and the second inverter 702 outputs the logic low voltage level due to that the second capacitor C2 maintains a logic high voltage level at the input terminal of the second inverter 702. When the voltage level of the first capacitor C1 is charged enough to transit the output voltage level of the first inverter 701, the output of the first inverter 701 is transited to the logic low voltage level. After the output of the first inverter 701 is transited to the logic low voltage level, charges of the second capacitor C2 are discharged to the output terminal of the first inverter 701 through the second resistor R2 and the third switch SW3.

When the voltage level of the second capacitor C2 is discharged enough to transit the output voltage level of the second inverter 702, the output of the second inverter 702 is transited to the logic high voltage level. Since charging of the first capacitor C1, discharging of the second capacitor C2, and the voltage level transition of the inverters 701 and 702 can cause the propagation delay time of the signal transmission unit 410_1, the propagation delay time can be adjusted by changing resistances of the resistors R1 and R2 and capacitances of the capacitors C1 and C2.

When the digital signal $S_{Digi}$ is again recovered to the logic low voltage level (for example, during the time points T43-T44), circuit operations of the signal transmission units 410_1-410_X are the same to that during the time points T41-T42, so that the signal transmission units 410_1-410_X can synchronously output the logic low voltage level.

Moreover, in the embodiment of FIG. 7, the switches SW1 and SW3 can be implemented by transmission gates, the second switch SW2 can be implemented by a NMOS transistor, and the fourth switch SW4 can be implemented by a PMOS transistor. In addition, the resistors R1 and R2 can be parasitic resistances of the circuit, and the capacitors C1 and C2 can be wire-to-ground parasitic capacitances.

Figure 8A:
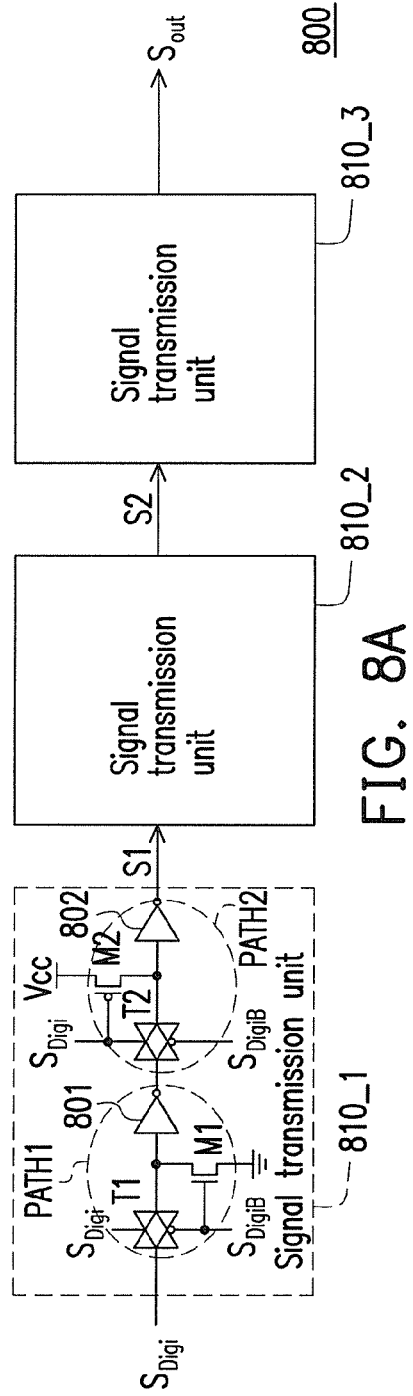
FIG. 8A is system schematic diagram of a deglitch circuit according to another embodiment of the present invention.

Another embodiment is provided below for further description. FIG. 8A is system schematic diagram of a deglitch circuit according to another embodiment of the present invention. Referring to FIG. 8A, in the present embodiment, the deglitch circuit 800 is, for example, a signal transmission unit string formed by three signal transmission units 810_1-810_3 connected in serial. Moreover, in the present embodiment, the parasitic resistances and the parasitic capacitances on the signal path and devices are used to respectively implement the first delay circuit and the second delay circuit, so as to save the physical resistors and the physical capacitors.

In the signal transmission unit 810_1, an input terminal of a first switch (a transmission gate T1) receives the digital signal $S_{Digi}$. A positive control terminal and a negative control terminal of the transmission gate T1 respectively receive the digital signal $S_{Digi}$ and a signal $S_{DigiB}$, wherein the signal $S_{DigiB}$ is an inverted signal of the digital signal $S_{Digi}$. A second switch (a NMOS transistor M1) is controlled by the signal $S_{DigiB}$. Wherein, a gate of the transistor M1 receives the signal $S_{DigiB}$, a source thereof is coupled to the ground voltage, and a drain thereof is coupled to an output terminal of the transmission gate T1. An input terminal of the inverter 801 is coupled to the output terminal of the transmission gate T1. An input terminal of a third switch (a transmission gate T2) is coupled to an output terminal of the inverter 801. A positive control terminal and a negative control terminal of the transmission gate T2 respectively receive the digital signal $S_{Digi}$ and a signal $S_{DigiB}$. A fourth switch (a PMOS transistor M2) is controlled by the digital signal $S_{Digi}$. Wherein, a gate of the transistor M2 receives the digital signal $S_{Digi}$, a source thereof is coupled to the system voltage Vcc, and a drain thereof is coupled to an output terminal of the transmission gate T2. An input terminal of the inverter 802 is coupled to the output terminal of the transmission gate T2, and an output terminal of the inverter 802 serves as an output terminal of the signal transmission unit 810_1, and is coupled to a first switch (not shown) of the next signal transmission unit 810_2 of the signal transmission unit string. Circuit structures of the signal transmission units 810_2 and 810_3 are similar to that of the signal transmission unit 810_1, and therefore detailed descriptions thereof are not repeated.

Figure 8B:
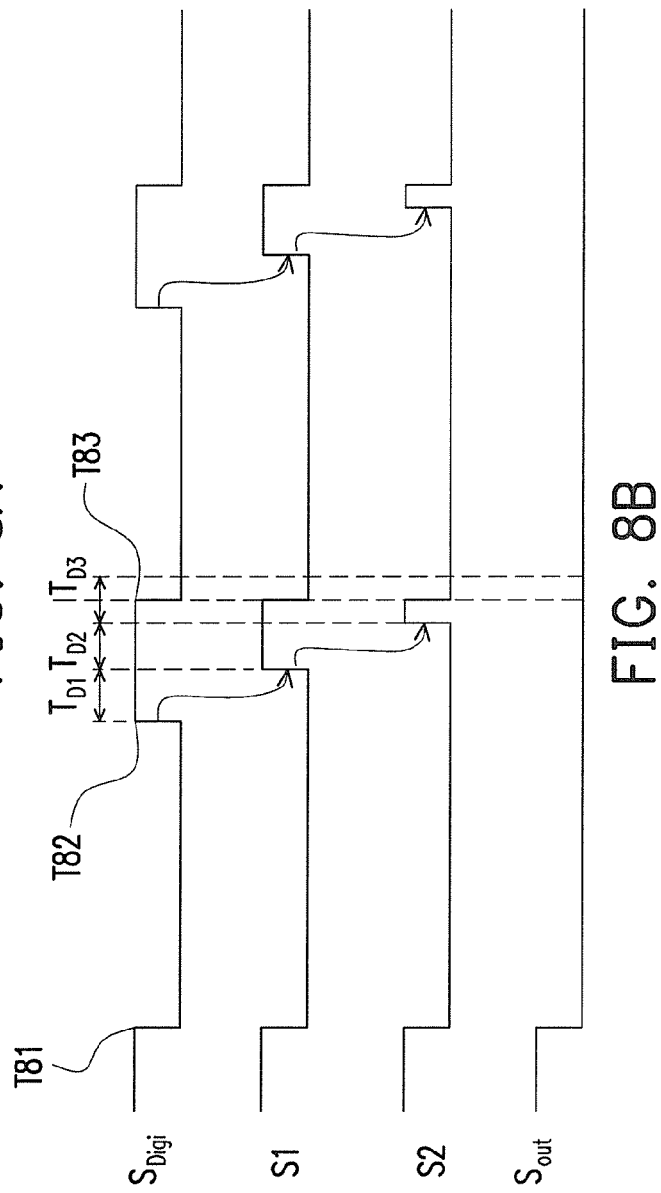
FIG. 8B is a waveform diagram of a digital signal and an output signal of FIG. 8A.

FIG. 8B is a waveform diagram of the digital signal and the output signal of FIG. 8A. Referring to FIG. 8A and FIG. 8B, at a time point T81, the digital signal $S_{Digi}$ is transited to the logic low voltage level, the transmission gates T1 and T2 are turned off, and the transistors M1 and M2 are turned on, so that the parasitic capacitance (not shown) of a signal path PATH1 is discharged through the transistor M1, and the system voltage Vcc charges the parasitic capacitance (not shown) of a signal path PATH2 through the transistor M2.

Meanwhile, the inverter 801 receives the ground voltage (regarded as the logic low voltage level) through the transistor M1 and outputs the logic high voltage level, and the inverter 802 receives the system voltage Vcc (regarded as the logic high voltage level) through the transistor M2 and outputs the logic low voltage level. Therefore, an output signal S1 of the signal transmission unit 810_1, an output signal S2 of the signal transmission unit 810_2, and an output signal Sout of the signal transmission unit 810_3 are synchronously transited to the logic low voltage level.

At a time point T82, the digital signal $S_{Digi}$ is transited to the logic high voltage level, the transmission gates T1 and T2 are turned on, and the transistors M1 and M2 are turned off, so that the digital signal $S_{Digi}$ can charge the parasitic capacitance (not shown) of the signal path PATH1 through the transmission gate T1 and parasitic resistance (not shown) of the signal path PATH1. Now, the inverter 801 still outputs the logic high voltage level, and the inverter 802 outputs the logic low voltage level due to that the parasitic capacitance (not shown) of the signal path PATH2 maintains a logic high voltage level at the input terminal of the inverter 802. Therefore, at the time point T82, the output signals 51, S2 and Sout of the signal transmission units 810_1-810_3 are all maintained to the logic low voltage level.

When the voltage level of the parasitic capacitance (not shown) of the signal path PATH1 of the signal transmission units 810_1 is charged enough to transmit the output voltage level of the inverter 801, the output of the inverter 801 is transited to the logic low voltage level. After the output of the inverter 801 is transited to the logic low voltage level, charges of the parasitic capacitance (not shown) of the signal path PATH2 are discharged to the output terminal of the inverter 801 through the parasitic resistance (not shown) of the signal path PATH2 and the transmission gate T2. When the voltage level of the parasitic capacitance (not shown) of the signal path PATH2 is discharged enough to transmit the output voltage level of the inverter 802, the output of the inverter 802 is transited to the logic high voltage level. Charging of the parasitic capacitance (not shown) of the signal path PATH1, discharging of the parasitic capacitance (not shown) of the signal path PATH2, and the voltage level transition of the inverters 801 and 802 can cause a propagation delay time $T_D1$ of the signal transmission unit 410_1. Namely, when the digital signal $S_{ag}$ is transited from the logic low voltage level to the logic high voltage level, due to a circuit operation of the signal transmission unit 810_1, the output signal S1 is delayed for one time period $T_{D1}$ before being correspondingly transited to the logic high voltage level.

Deduced by analogy, after the signal transmission unit 810_2 receives the output signal S1 having the logic high voltage level, the output signal S2 is also delayed for one time period $T_D2$ before being correspondingly transited to the logic high voltage level. After the signal transmission unit 810_3 receives the output signal S2 having the logic high voltage level, according to the circuit operation, the output signal Sout of the signal transmission unit 810_3 is supposed to be delayed for one time period $T_{D3}$ compared to the output signal S2 before being correspondingly transited to the logic high voltage level. However, since the digital signal $S_{ag}$ is transited to the logic low voltage level at the time point T83, the logic light voltage level intended to be output by the signal transmission unit 810_3 after the time period TD3 is eliminated due to the synchronously outputting caused by the digital signal $S_{ag}$ being transited to the logic low voltage level. Therefore, the output signal Sout of the signal transmission unit 810_3 is maintained to the logic low voltage level.

Figure 9:
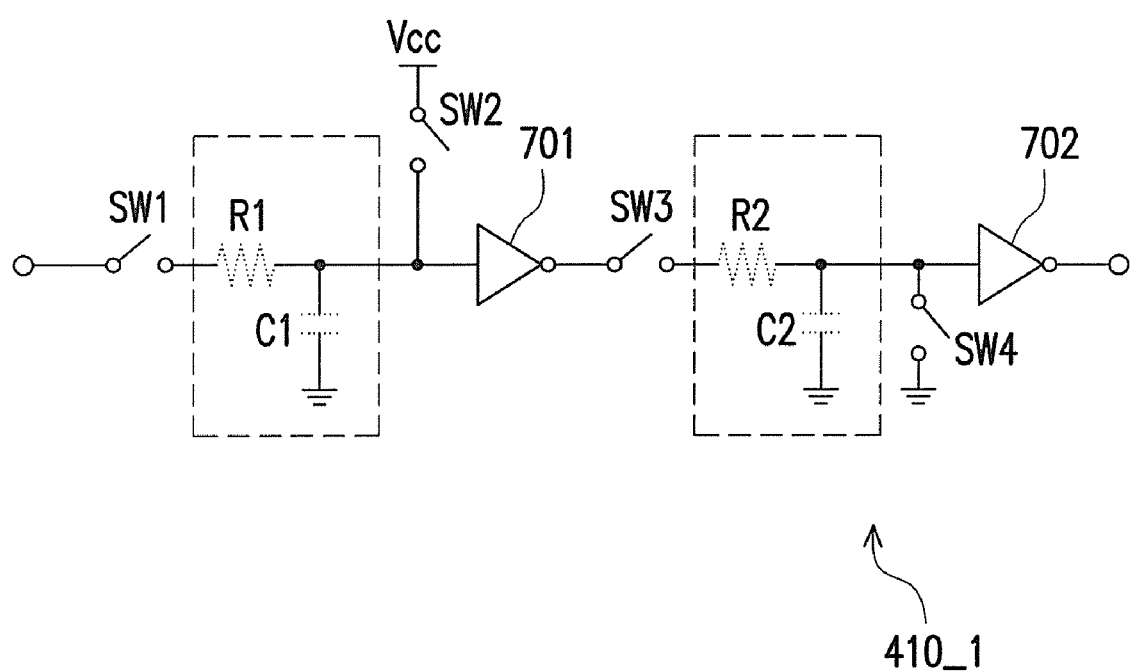
FIG. 9 is yet another circuit diagram of a signal transmission unit 410_1 of FIG. 4A.

Moreover, if the glitch PL1 to be eliminated has the logic low voltage level, eliminating the glitch PL1 can be implemented by varying a connecting relation and the circuit operation of the circuit of FIG. 7. FIG. 9 is yet another circuit diagram of the signal transmission unit 410_1 of FIG. 4A. Referring to FIG. 7 and FIG. 9, a main difference there between lies in the switches SW2 and SW4. In the present embodiment, the second switch SW2 is coupled between the second terminal of the first resistor R1 and the system voltage Vcc, and the fourth switch SW4 is coupled between the second terminal of the second resistor R2 and the ground voltage.

When the digital signal has the a first logic state (e.g. logic high voltage level), the switches SW1 and SW3 are turned off, and the switches SW2 and SW4 are turned on, so that the first inverter 701 receives the system voltage Vcc (regarded as the logic high voltage level) and outputs the logic low voltage level, and the second inverter 702 receives the ground voltage (regarded as the logic low voltage level) and outputs the logic high voltage level. Moreover, the system voltage Vcc charges the first capacitor C1.

When the digital signal has a second logic state (e.g. the logic low voltage level), the switches SW1 and SW3 are turned on, and the switches SW2 and SW4 are turned off, so that the first capacitor C1 is discharged through the first resistor R1. Now, since the voltage of the first capacitor C1 still has the logic high voltage level, the first inverter 701 can output the logic low voltage level, and the second inverter 702 still outputs the logic high voltage level. When the voltage level of the first capacitor C1 is discharged enough to transit the output voltage level of the first inverter 701, the output of the first inverter 701 is transited to the logic high voltage level. Now, the second capacitor C2 is charged.

When the voltage level of the second capacitor C2 is charged enough to transit the output voltage level of the second inverter 702, the output of the second inverter 702 is transited to the logic low voltage level. Discharging of the capacitor first C1, charging of the second capacitor C2, and the voltage level transition of the inverters 701 and 702 can cause a propagation delay time of the signal transmission unit 410_1. The propagation delay time can be adjusted by changing resistances of the resistors R1 and R2 and capacitances of the capacitors C1 and C2.

It should be noticed that in other embodiments, a power source of the inverter(s) or the buffer(s) can be replaced by an accurate current source. By such means, a time variation of the propagation delay can be reduced, so that a circuit design of the high-speed transmission system can be more accurate.

In summary, in the deglitch circuit of the present invention, if the glitch has the logic high voltage level, and when the digital signal has the logical low voltage level, the signal transmission units can synchronously output the logic low voltage level, while when the digital signal has the logical high voltage level, the signal transmission units can sequentially output the digital signal. The glitch can be delayed for transmission due to the plurality of the signal transmission units, and can be eliminated when the digital signal is recovered to the logic low voltage level. If the glitch has the logic low voltage level, the circuit is modified to reverse the circuit operation of the deglitch circuit, by which the glitch can also be eliminated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A deglitch circuit, comprising:
a plurality of signal transmission units, the signal transmission units being connected in serial to form a signal transmission unit string, and a first signal transmission unit of the signal transmission unit string receiving a digital signal, wherein one of the signal transmission units comprises:
a first switch, having a first terminal coupled to a previous signal transmission unit of the signal transmission unit string and a control terminal receiving the digital signal, wherein the first switch is turned off when the digital signal has a first logic state, and the first switch is turned on when the digital signal has a second logic state;
a first delay circuit, having an input terminal coupled to a second terminal of the first switch; and
a second switch, coupled between an output terminal of the first delay circuit and a first voltage, wherein a control terminal of the second switch receiving the digital signal, the second switch is turned on when the digital signal has the first logic state, and the second switch is turned off when the digital signal has the second logic state.

2. The deglitch circuit as claimed in claim 1, wherein the first delay circuit comprises:
a first resistor, having a first terminal coupled to the second terminal of the first switch; and
a first capacitor, coupled between a second terminal of the first resistor and a second voltage.

3. The deglitch circuit as claimed in claim 2, wherein the first resistor is a parasitic resistance.

4. The deglitch circuit as claimed in claim 2, wherein the first capacitor is a parasitic capacitance.

5. The deglitch circuit as claimed in claim 1, wherein each of the signal transmission units further comprises a buffer, wherein an input terminal of the buffer is coupled to the output terminal of the first delay circuit, and an output terminal of the buffer is coupled to a next signal transmission unit of the signal transmission unit string.

6. The deglitch circuit as claimed in claim 1, wherein each of the signal transmission units further comprises:
a first inverter, having an input terminal coupled to the output terminal of the first delay circuit;
a third switch, having a first terminal coupled to an output terminal of the first inverter and a control terminal receiving the digital signal, wherein the third switch is turned off when the digital signal has the first logic state, and the third switch is turned on when the digital signal has the second logic state;
a second delay circuit, having an input terminal coupled a second terminal of the third switch;
a fourth switch, coupled between an output terminal of the second delay circuit and a third voltage, wherein a control terminal of the fourth switch receiving the digital signal, the fourth switch is turned on when the digital signal has the first logic state, and the fourth switch is turned off when the digital signal has the second logic state; and
a second inverter, having an input terminal coupled to the output terminal of the second delay circuit, and an output terminal coupled to a next signal transmission unit of the signal transmission unit string.

7. The deglitch circuit as claimed in claim 6, wherein the second delay circuit comprises:
a second resistor, having a first terminal coupled to the second terminal of the third switch; and
a second capacitor, coupled between a second terminal of the second resistor and the second voltage.

8. The deglitch circuit as claimed in claim 7, wherein the second resistor is a parasitic resistance.

9. The deglitch circuit as claimed in claim 7, wherein the second capacitor is a parasitic capacitance.

10. The deglitch circuit as claimed in claim 7, wherein the second voltage is a ground voltage.

11. The deglitch circuit as claimed in claim 6, wherein the first voltage and the third voltage are respectively a ground voltage and a system voltage.

12. The deglitch circuit as claimed in claim 6, wherein the first and the third switches are respectively a transmission gate.

13. The deglitch circuit as claimed in claim 6, wherein the second and the fourth switches are respectively a NMOS transistor and a PMOS transistor.

14. The deglitch circuit as claimed in claim 1, wherein the first logic state and the second logic state are respectively a logic low level and a logic high level.

* * * * *